United States Patent
Cranford, Jr. et al.

(10) Patent No.: US 8,130,887 B2
(45) Date of Patent: *Mar. 6, 2012

(54) METHOD AND ARRANGEMENTS FOR LINK POWER REDUCTION

(75) Inventors: Hayden Clavie Cranford, Jr., Cary, NC (US); Gareth John Nicholls, Brockenhurst (GB); Vernon Roberts Norman, Cary, NC (US); Martin Leo Schmatz, Rueschlikon (CH); Karl David Selander, Hopewell Junction, NY (US); Michael Anthony Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 960 days.

This patent is subject to a terminal disclaimer.

(21) Appl. No.: 12/124,106

(22) Filed: May 20, 2008

(65) Prior Publication Data

US 2008/0285695 A1 Nov. 20, 2008

Related U.S. Application Data

(63) Continuation of application No. 10/915,790, filed on Aug. 11, 2004, now Pat. No. 7,397,876.

(51) Int. Cl.
*H04L 7/00* (2006.01)
(52) U.S. Cl. .................................................... 375/355
(58) Field of Classification Search .................... 375/355
See application file for complete search history.

(56) References Cited

U.S. PATENT DOCUMENTS

| 5,020,038 | A | 5/1991 | Swapp et al. |
|---|---|---|---|
| 5,087,828 | A | 2/1992 | Sato et al. |
| 5,121,411 | A | 6/1992 | Fluharty |
| 5,185,768 | A | 2/1993 | Ferraiolo et al. |
| 5,212,716 | A | 5/1993 | Ferraiolo et al. |
| 5,687,203 | A | 11/1997 | Baba |
| 6,278,755 | B1 | 8/2001 | Baba et al. |
| 6,377,094 | B1 | 4/2002 | Carley |
| 6,560,305 | B1 | 5/2003 | Croughwell |
| 6,590,509 | B2 | 7/2003 | Labrie |
| 7,310,397 | B2 | 12/2007 | Smith et al. |
| 7,397,876 | B2* | 7/2008 | Cranford et al. ............. 375/355 |
| 2006/0280272 | A1* | 12/2006 | Stojanovic ............... 375/355 |

* cited by examiner

*Primary Examiner* — Don N Vo
(74) *Attorney, Agent, or Firm* — Ian D. MacKinnon

(57) ABSTRACT

Methods and arrangements to determine phase adjustments for a sampling clock of a clock and data recovery (CDR) loop based upon subsets of data samples, or values, derived from an incoming data signal are disclosed. In particular, embodiments extend the CDR loop by slowing the clock rate with respect to the sampling clock. For instance, the slower clock rate may be implemented by dividing the frequency of the sampling clock by a number such as 128, slowing a sampling clock frequency designed to handle multiple gigabits per second (Gbps) to a frequency of less than one kilohertz (Khz). In addition to the reduced power consumption realized by operating at a lower frequency, the slower clock rate allows components of the CDR loop circuitry to operate a lower operating voltage reducing power consumption by the CDR loop even more.

14 Claims, 5 Drawing Sheets

FIG 3

| SAMPLE #0 EDGE 0 | SAMPLE #1 DATA | SAMPLE #2 EDGE 1 | OUTPUT | ABRE-VIATION | OUT 0 | OUT 1 | OUT 2 |
|---|---|---|---|---|---|---|---|
| 0 | 0 | 0 | NO VALID EDGE FOUND | IDLE | 1 | 0 | 0 |
| 0 | 0 | 1 | RISING EDGE & LATE | R, L | 0 | 1 | 0 |
| 0 | 1 | 0 | NO ACTION REQUIRED | IDLE | 1 | 0 | 0 |
| 0 | 1 | 1 | RISING EDGE & EARLY | R, E | 0 | 1 | 1 |
| 1 | 0 | 0 | FALLING EDGE & EARLY | F, E | 0 | 0 | 1 |
| 1 | 0 | 1 | NO ACTION REQUIRED | IDLE | 1 | 0 | 0 |
| 1 | 1 | 0 | FALLING EDGE & LATE | F, L | 0 | 0 | 0 |
| 1 | 1 | 1 | NO VALID EDGE | IDLE | 1 | 0 | 0 |

300 → ; 310 (inputs); 320 (output/abbreviation); 330 (OUT 0/1/2)

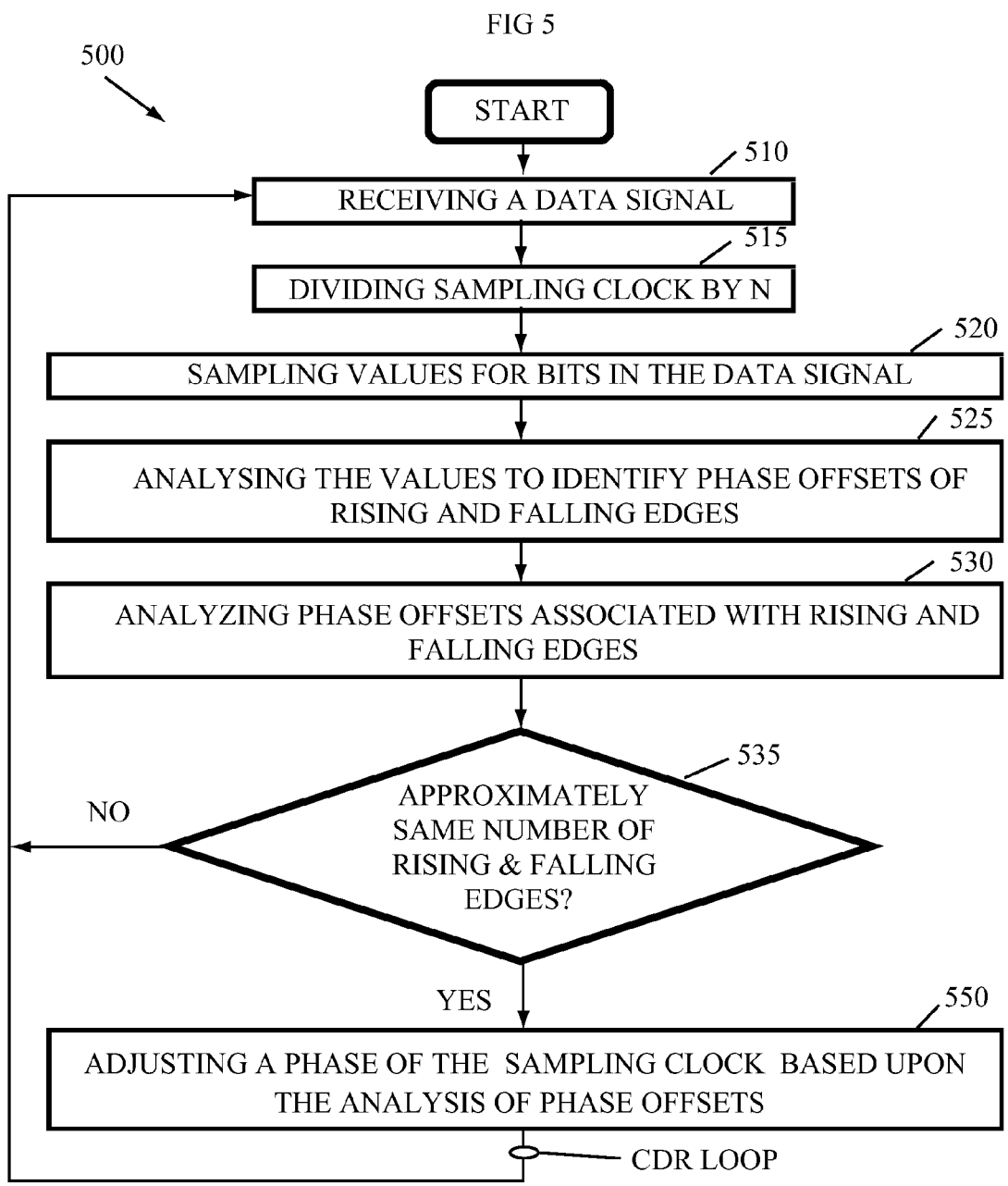

METHOD AND ARRANGEMENTS FOR LINK POWER REDUCTION

CROSS-REFERENCES TO RELATED APPLICATIONS

This application is a continuation application of U.S. patent application Ser. No. 10/915,790, entitled "Methods and Arrangements for Link Power Reduction", filed Aug. 11, 2004, now U.S. Pat. No. 7,397,876, the disclosure of which is incorporated herein in its entirety for all purposes.

BACKGROUND

The present invention is in the field of data transmission. More particularly, the present invention relates to methods and arrangements to determine phase adjustments for a sampling clock of a clock and data recovery (CDR) loop based upon subsets of values derived from an incoming data signal for reducing power consumption by the CDR loop.

Communication systems typically include logic and hardware to transmit data from an originating device to a target device. In particular, communication systems have routing or switching logic to make high-level decisions that select ports, routes, and media for transmitting the data. Communication systems also include links, each having a transmitter, a medium, and a receiver, to transmit the data in response to those high-level decisions. Data is clocked by the transmitter and transmitted to a receiver, e.g., from a router to a hub, computer to computer, or one processor card to another processor card. However, the clock signal utilized to clock the data, in many applications, may not be transmitted with the data. One reason for not transmitting the clock signal with the data is that the clock signal induces noise to the data streams, increasing bit errors. Second, transmission of the clock signal utilizes bandwidth that can otherwise be used to transmit additional data. Third, transmitting the clock signal consumes power that is unnecessary because the receiver can reproduce the clock signal.

Even when transmitting data across a transmission medium without the corresponding clock signals, noise introduced during the data transmission, such as transmitter jitter, channel jitter and data dependent jitter, reduces the sampling window for data. For example, transmitter jitter can result from many sources such as feed through, random jitter, systematic offsets and duty cycle distortion. Duty cycle distortion, for instance, is caused by non-symmetric positive and negative duty cycles of a data symbol and can show up either as a high frequency correlated jitter or as a phase step. Further, channel jitter can result from phase dispersion, such as inter-symbol interference (ISI). When a data sequence that contains long consecutive trails of ones and zeros, for example 0000011111100000000111111111 etc., is transitioning in a data signal that has very short trails of ones and zeros, for example 01010101010101010 etc., differences in the propagation delay between the low fundamental frequency of the former example with respect to the high fundamental frequency in the latter example can cause phase shifts at each transition point. The phase shifts, phase steps, and reduced duty cycles reduce the perceivable data-sampling window for the receiver.

When the data is transmitted without the clock signal, clocks in both the transmitter and the receiver must be coordinated to match so that data can be sampled at the center of the data sampling window. If the clocks are at substantially the same frequency, matching the clock signals is just a matter of adjusting the phase of the receiver clock to match the phase of the transmitter's clock. Thus, the phases can be matched by monitoring for a phase shift in the data.

Receivers may compensate for the smaller sampling window by attempting to align a data sampling clock signal, or recovered clock signal, with the center of the data-sampling window. More specifically, receivers typically implement a clock and data recovery (CDR) loop to track differences in phase between the data signal and sampling clock and modify the phase of the sampling clock to track the data signal. When the sampling clock is in phase with the data signal, a 90-degree phase-shift of the sampling clock will place transitions of the phase-shifted clock in the center of the sampling window.

Computations based upon sample values for bits of the data signal (typically two to four values per bit) indicate whether the phase of the sampling clock is out of sync with the phase of the data signal. For instance, assuming that the bit being sampled is a high voltage, and the prior and subsequent bits are low voltages, three sample values of the bit may be read from the data signal based upon transitions of the sampling clock. When the phase of the sample clock lags the phase of the data signal, the first two sample values read from the data signal will be a high voltage read from the bit and the next sample value will be a low voltage read from the next bit. Similarly, when the phase of the sample clock leads the phase of the data signal, the first sample value will be a low voltage read from the previous bit and the next two sample values will be a high voltage. Generally, the results are averaged over a sampling window of bits and, when, on average, the sampling clock is determined to be leading or lagging, the phase of the sampling clock is modified accordingly.

However, the rate of phase changes needed to maintain the sampling clock in phase with the data signal is significantly slower than the sampling rate. As a result, the sample data is averaged to assure that the information upon which phase changes are determined is accurate but the circuitry implemented to average the data samples operates at a much higher frequency than the phase changes. Components operating at the higher frequency must, in turn, operate at a higher operating voltage, than would be necessary if the components operated at a frequency nearer to frequency of phase adjustments to compensate for phase changes of the incoming data signal.

One solution is to reduce the sampling rate for data utilized to determine the phase adjustments for the sampling clock, reducing the clock speed and the operating voltage. However, reducing the sampling rate creates new problems related to asymmetrical sampling, which can provide erroneous information regarding whether the phase difference between the data signal and the sampling clock signal is leading, lagging, or substantially the same.

SUMMARY

The problems identified above are in large part addressed by methods and arrangements for reducing power consumption by a clock and data recovery loop. One embodiment provides a clock and data recovery loop. The clock and data recovery loop contemplates sampling circuitry to determine values for bits in a data signal based upon transitions of a sampling clock; and edge analysis circuitry coupled with the sampling circuitry to determine a phase adjustment for the sampling clock. The phase adjustment for the sampling clock may be based upon a subset of the values for the bits. The subset of the values may have substantially equivalent numbers of rising edges and falling edges that are associated with transitions of the data signal. The phase adjustment is adapted to track a difference in phase between the sampling clock and the data signal.

Another embodiment provides a method for reducing power consumption by a clock and data recovery loop. The method contemplates determining values for bits in a data signal based upon transitions of a sampling clock and determining a frequency at which to select a portion of the values. Upon collecting a portion of the sample values, analyses the portion of the values to associate the portion of the values with phase offsets. Then, the method identifies a subset of the portion of the values, the subset representing substantially equivalent numbers of values for rising edges and falling edges of the data signal and compares the phase offsets associated with the subset of the values to determine a phase adjustment for the sampling clock.

Another embodiment provides a system having reduced power consumption associated a clock and data recovery loop. The system generally includes a clock generator to generate a sampling clock and sampling circuitry to sample values for bits from a data signal based upon the sampling clock to output the bits in a second data signal. The sampling circuitry then propagates the bits to other circuitry via a second data signal. Further, edge analysis circuitry is coupled with the sampling circuitry to analyze a subset of the values for bits to generate a phase adjustment indicative of a difference between a phase of the sampling clock and a phase of the data signal. The subset of the values represent substantially equal numbers of values for rising edges and falling edges of the data signal. Then, a phase controller adjusts the phase of sampling clock in response to the phase adjustment

BRIEF DESCRIPTION OF THE DRAWINGS

Other objects and advantages of the invention will become apparent upon reading the following detailed description and upon reference to the accompanying drawings in which, like references may indicate similar elements:

FIG. 3 depicts an example of a truth table for edge analysis logic such as the edge analysis logic in FIG. 2;

FIG. 5 depicts an example of a flow chart to implement phase adjustments for a sampling clock of a clock and data recovery (CDR) loop based upon subsets of values derived from an incoming data signal.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements to determine phase adjustments for a sampling clock of a clock and data recovery (CDR) loop based upon subsets of data samples, or values, derived from an incoming data signal are contemplated. In particular, embodiments extend the CDR loop by slowing the clock rate with respect to the sampling clock. For instance, the slower clock rate may be implemented by dividing the frequency of the sampling clock by a number such as 128, slowing a sampling clock frequency designed to handle multiple gigabits per second (Gbps) to a frequency of less than one kilohertz (KHz). In addition to the reduced power consumption realized by operating at a lower frequency, the slower clock rate allows components of the CDR loop circuitry to operate a lower operating voltage reducing power consumption by the CDR loop even more.

In one embodiment, the power consumption for the CDR loop is reduced by at least two orders of magnitude. Advantageously, for embodiments in which the CDR loop is incorporated into a receiver of a serial data link, reducing the power consumption by the CDR loop can significantly reduce the power consumption by the receiver and, in turn, the serial data link.

Further, embodiments implement edge analysis circuitry to identify rising and falling edges and to determine phase adjustments based upon substantially the same number of rising and falling edges. Advantageously, basing phase adjustment determinations on substantially the same number of rising and falling edges avoids or attenuates problems associated with misinterpreting data samples which cause the CDR loop to either fail to initiate a phase adjustment or initiate a phase adjustment that is unnecessary and/or counter-productive.

While specific embodiments will be described below with reference to particular circuit configurations of CDR loops, those of skill in the art will realize that embodiments of the present invention may advantageously be implemented with other substantially equivalent circuit configurations.

Figure 1:
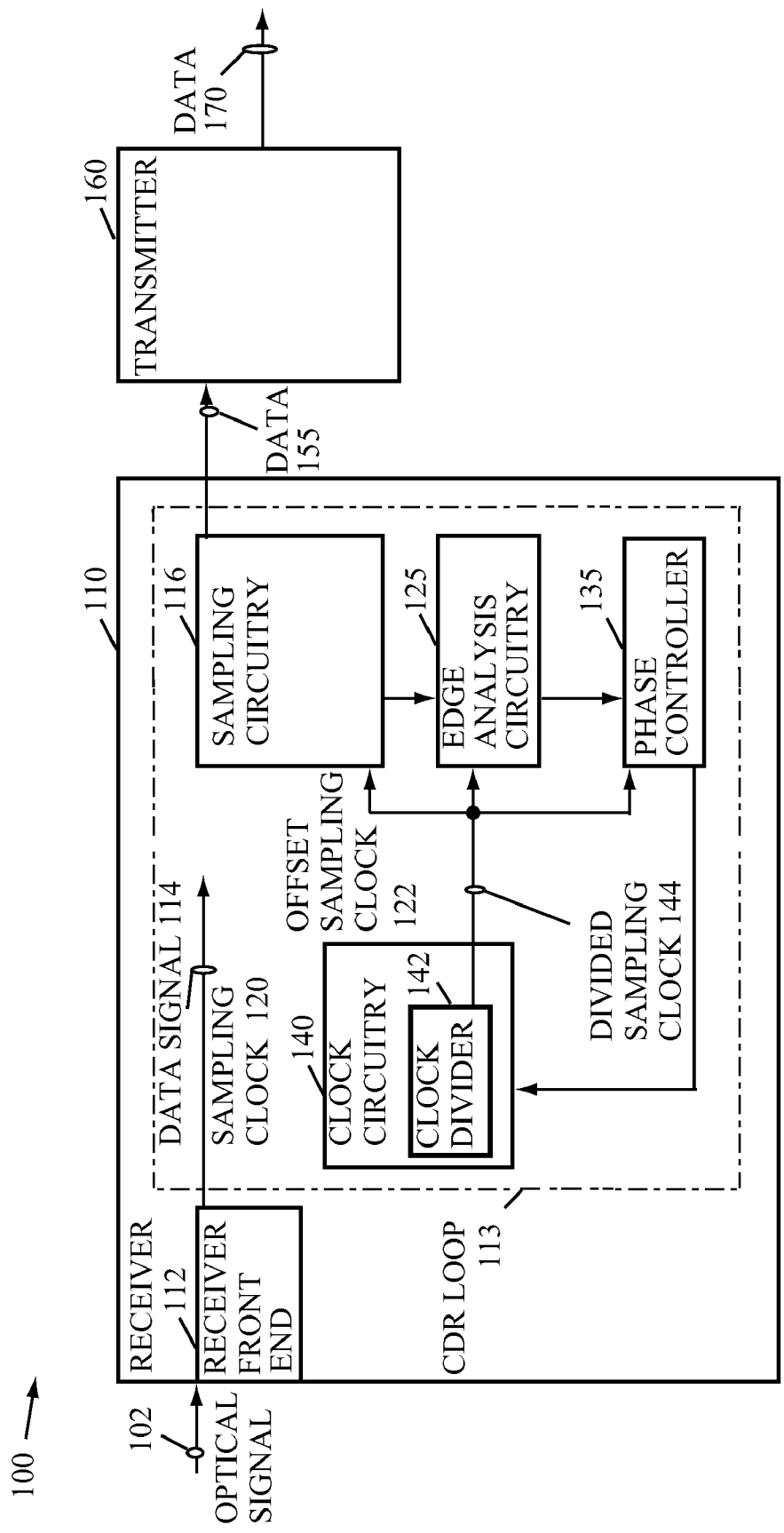
FIG. 1 depicts an embodiment of a transmitter coupled with a receiver having a clock and data recovery (CDR) loop to re-clock a data signal.

Turning now to the drawings, FIG. 1 depicts an embodiment of a hub 100 for a link that includes a receiver 110 having a clock and data recovery (CDR) loop 113 to re-clock a data signal 114 and a transmitter 160 coupled with receiver 110 to re-transmit the data as a data signal 170. For example, hub 100 may receive an optical signal 102 via a first high-speed, optical serial link, convert the optical signal 102 into an electrical data signal 114, interpret the data 155 of data signal 114 via CDR loop 113, transmit data 155 to transmitter 160, and transmit data 155 through another high-speed data link via data signal 170.

In further embodiments, hub 100 may include one or more Serializer-Deserializer (SerDes) chips to receive a parallel data signal and transmit the data as a serial data signal. For instance, receiver 110 may receive eight bits of data in parallel and transmit the data to transmitter 160 as data 155. Transmitter 160 may include a first-in, first-out (FIFO) data queue and circuitry to accommodate a disparity in the data rates between the parallel transmission and the serial data transmission, data 170.

Receiver 110 may receive optical signal 102 via, e.g., a 3.125 Gigabits per second (Gb/s) link and interpret the data of optical signal 102 for re-transmission across a different network at, e.g., 3.0 Gb/s. Receiver 110 may include a receiver front end 112, sampling circuitry 116, edge analysis circuitry 125, a phase controller 135, and clock circuitry 140. Receiver front end 112 may receive a signal from a transmission medium, such as an optical fiber. Then, receiver front end 112 may convert the optical signal into an electrical signal, data signal 114, and amplify data signal 114 via a low noise amplifier to adjust the amplitude for the sampling circuitry 116.

Sampling circuitry 116 may receive data signal 114 from the receiver front end 112 and sample data from the data signal 114 with a sampling clock 120. Sampling circuitry 116 samples, or measures values of the data signal 114 to determine the data being transmitted as well as to determine whether sampling clock 120 is in phase with data signal 114. In particular, the effective sampling window for accurate interpretation of data from data signal 114 may be reduced due to, e.g., noise introduced into the signal and other phase changing problems. Thus, sampling circuitry 116 transmits the values to edge analysis circuitry 125 to track changes in the phase of data signal 114. Embodiments communicate less than all of the values sampled by sampling circuitry 116 because the typical frequency of phase adjustments required to track the time-varying phase of data signal 114 with sampling clock 120 is slow with respect to the frequency of the sampling clock 120, e.g., on the order of $1/100^{th}$. Tracking the phase changes of data signal 114 with sampling clock 120 improves the accuracy of the values sampled from data signal 114.

Sampling circuitry 116 facilitates a comparison of the phase of data signal 114 with the phase of sampling clock 120 by taking more than one sample of each data bit of data signal 114. In some embodiments, sampling clock 120 may be a multiple of the frequency of an anticipated clock frequency for the data signal 114. In the present embodiment, clock circuitry 140 generates sampling clock 120 at a frequency substantially equivalent to the anticipated frequency of data signal 114 and also generates an offset sampling clock 122 offset from the sampling clock 120 by 90 degrees. Being 90 degrees out of phase from the sampling clock 120, the offset sampling clock 122 advantageously includes an edge in the center of the sampling window.

In the present embodiment, sampling circuitry 116 takes three samples for each bit in data signal 114, an edge sample and two data samples. Edge samples are values of bits measured from the data signal at the rising and falling edges of sample clock 120. Data samples are values measured at the rising and falling edges of the offset sampling clock 122. Sampling circuitry 116 transmits data samples to transmitter 160 via data 155 and transmits edge and data samples to edge analysis circuitry 125 at a rate based upon a divided sampling clock 144 having a frequency of 1/Nth that of sampling clock 120. For example, divided sampling clock 144 may have a frequency of $1/128^{th}$ the frequency of sampling clock 120, reducing power consumption by CDR loop 113.

In other embodiments, edge analysis circuitry 125 may process two edge samples and one data sample so that a narrow pulse, which is common for systems with ISI, will cause a lead and lag indication together. Thus, edge analysis circuitry 125 can correctly interpret the lead and lag indications as an indication not to make an adjustment to phase of sampling clock 120.

In further embodiments, edge analysis circuitry 125 may burst process all samples instead of occasionally processing of a few samples, advantageously providing more jitter tolerance, especially if the sleep time is autonomic. For example, edge analysis circuitry 125 may use all edge and data samples for a short period of time and then may enter a sleep mode, or low power mode, for a period of time. In one such embodiment, the sleep time may be adjusted based upon prior and/or current phase adjustment determinations. Upon determining a phase adjustment, there may be no need to process data samples for a period of time anyways because of the lag time between determining a phase adjustment to implement and realizing the phase adjustment in the sampling clock 120. Therefore, placing edge analysis circuitry 125 in a sleep mode may advantageously reduce power consumption with little or no impact to the ability for CDR loop 113 to track data signal 114.

Edge analysis circuitry 125 may receive the samples of data signal 114 taken by sampling circuitry 116, determine that sampling clock 120 leads or lags data signal 114, and, in response, generate a phase up/down signal, or phase adjustment signal, to instruct phase controller 135 on phase adjustments for sampling clock 120. In particular, edge analysis circuitry 125 may determine whether the phase of sampling clock 120 is different from the phase of data signal 114. If the phase of data signal 114 is different from the phase of sampling clock 120, edge analysis circuitry 125 may also determine whether the phase of sampling clock 120 leads or lags the phase of data signal 114. For example, three values are taken for each bit of data signal 114, two based upon the rising and falling edges of sample clock 120 and one based upon the rising or falling edge of offset sampling clock 122. When sampling clock 120 is in phase with data signal 114, the rising and falling edges of sample clock 120 should coincide with the rising and falling edges of data signal 114, and rising and falling edges of offset sampling clock 122 should provide a value for the data from near or at the center of the sampling window.

However, when sample clock 120 is out of phase with data signal 114, the edge and data values will be different. For instance, when sample clock 120 lags data signal 114 by a several degrees, the bit value being sampled is a logical one, and the next bit value of data signal 114 is a logical zero, the first two samples may indicate a logical one while the last sample indicates a logical zero. Alternatively, when sample clock 120 leads data signal 114 by several degrees, the bit value being sampled is a logical one, and the previous bit value is a logical zero, the first sample may indicate a logical zero while the last two samples indicate a logical one.

Edge analysis circuitry 125 may also track edges related to data from data signal 114 to assure that substantially the same number of rising and falling edges are considered in phase adjustment determinations. For instance, edge analysis circuitry 125 may associate a value with a type of edge and track the difference between the number of rising edge values and falling edge values. In one embodiment, edge analysis circuitry 125 maintains a count for both the rising edges and the falling edges.

Phase controller 135 may generate one or more control signals to modify the phase of sampling clock 120 based upon computations by edge analysis circuitry 125 and transmit a control signal to clock circuitry 140 to implement the changes. More specifically, phase controller 135 is designed to operate at the frequency of divided sampling clock 122 to control the phase changes necessary for sampling clock 120 to track data signal 114. Phase controller 135 may implement the changes in response to the phase adjustment signal output from edge analysis circuitry 125.

Clock circuitry 140 may generate a clock signals such as sampling clock 120, offset sampling clock 122 and divided sampling clock 144. In some embodiments, clock circuitry 140 may include a voltage-controlled oscillator (VCO) designed to generate a signal having a frequency based upon a voltage input. In many embodiments, the clock circuitry 140 may generate sampling clock signal 120 by combining more than one phases of the signal generated by the VCO. The magnitude of the contributions from each phase may then be adjusted up or down by phase controller 135 depending upon whether the phase of the sampling clock 120 should be moved up or down to track the phase of data signal 114.

Clock circuitry 140 may include a clock divider 142. Clock divider 142 may generate divided sampling clock 144 by dividing the frequency of sampling clock 120 by a number, N. The number N may be a constant or may be adjusted depending upon the frequency of the data signal. In some embodiments, the number N may be dynamically adapted based upon the ability of CDR loop 113 to track data signal 114.

Figure 2:
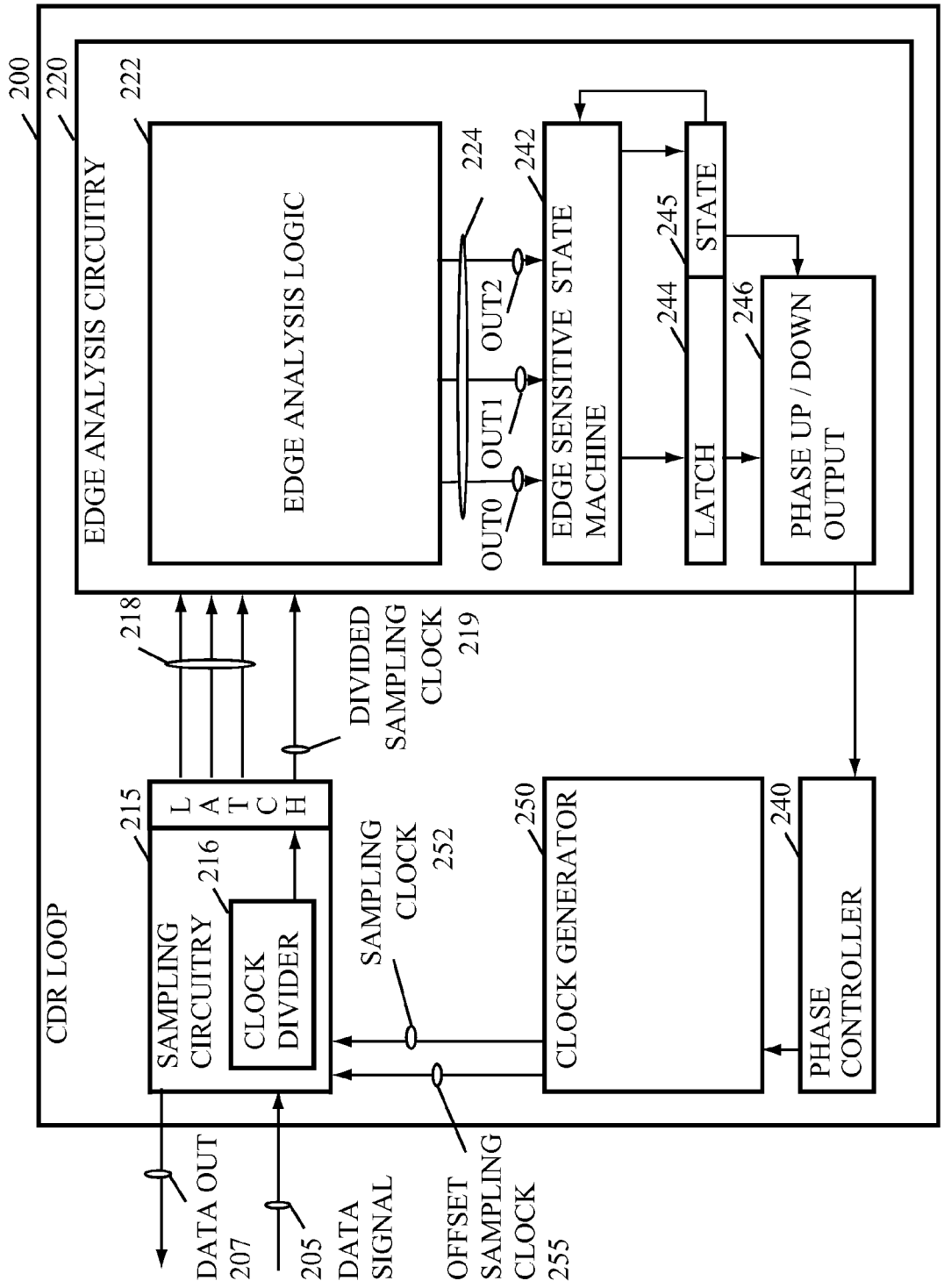
FIG. 2 depicts an embodiment of a CDR loop including a frequency divider, edge analysis logic, and an edge sensitive state machine.

FIG. 2 depicts an embodiment of a clock and data recovery (CDR) loop 200 with edge analysis circuitry 220 to identify bits of data in a data signal 205 to output as data out 207. Edge analysis circuitry 220 may also track phase changes in data signal 205 so that the phase of a sampling clock 252 may be tuned based upon differences between the phase of data signal 205 and sampling clock 252. In particular, CDR loop 200 is adapted to determine phase adjustments for sampling clock 252 based upon a subset of data values from data signal 205, reducing the frequency of operation of CDR loop 200 and, in many embodiments, the operating voltage of many or all of the components of CDR loop 200. Phase change determinations are based upon substantially equivalent numbers of rising and falling edges of the subset of samples to advantageously avoid problems associated with unsymmetrical rising and falling edge transitions.

CDR loop 200 includes sampling circuitry 215, an edge analysis circuitry 220, a phase controller 240, and a clock generator 250. In particular, sampling circuitry 215 may receive the data signal 205 and sample bit values with sampling clock 252 and an offset sampling clock 255, which is 90 degrees out of phase with sampling clock 252.

Sampling circuitry 215 measures more than one value for each bit on average in data signal 205 to determine the phase relationship between the data signal 205 and the sampling clock 252. Measuring a value for a bit may include, e.g., comparing the voltage of the data signal against a reference voltage. In some embodiments, sampling circuitry 215 may also store a large series of these values in memory to transfer to edge analysis circuitry 220. In many embodiments, sampling circuitry 215 may measure two or three values per bit, although in some embodiments, sampling circuitry 215 may determine more than three values per bit. Sampling circuitry 215 then transfers the bit samples 218, such as a consecutive set of samples for an edge, data, and another edge, to edge analysis circuitry 220 via a latch and at a frequency determined by clock divider 216.

Clock divider 216 may divide the frequency of sampling clock 252 to generate divided sampling clock 219. Divided sampling clock 219 can then be used to clock edge analysis circuitry 220 and, in several embodiments, phase controller 240 to reduce power consumption of CDR loop 200. For example, for a 2.5 Gb/s half-rate system with a sampling clock 252 divided by at least 128, components of, e.g., edge analysis circuitry 220 may be clocked at less than 10 Mega-Hertz (MHz), advantageously reducing power consumption of CDR loop 200 to nearly zero with respect to power consumption by the receiver front end circuitry.

Edge analysis circuitry 220 may generate a comparison signal based upon the samples received from sampling circuitry 215 to indicate whether sampling clock 217 leads, lags, or is in-phase with data signal 205. In particular, edge analysis circuitry 220 may include an edge analysis logic 222, an edge sensitive state machine 242, an early/late adder including latch 244 and state 245, and a phase up/phase down output 246.

Figure 4:
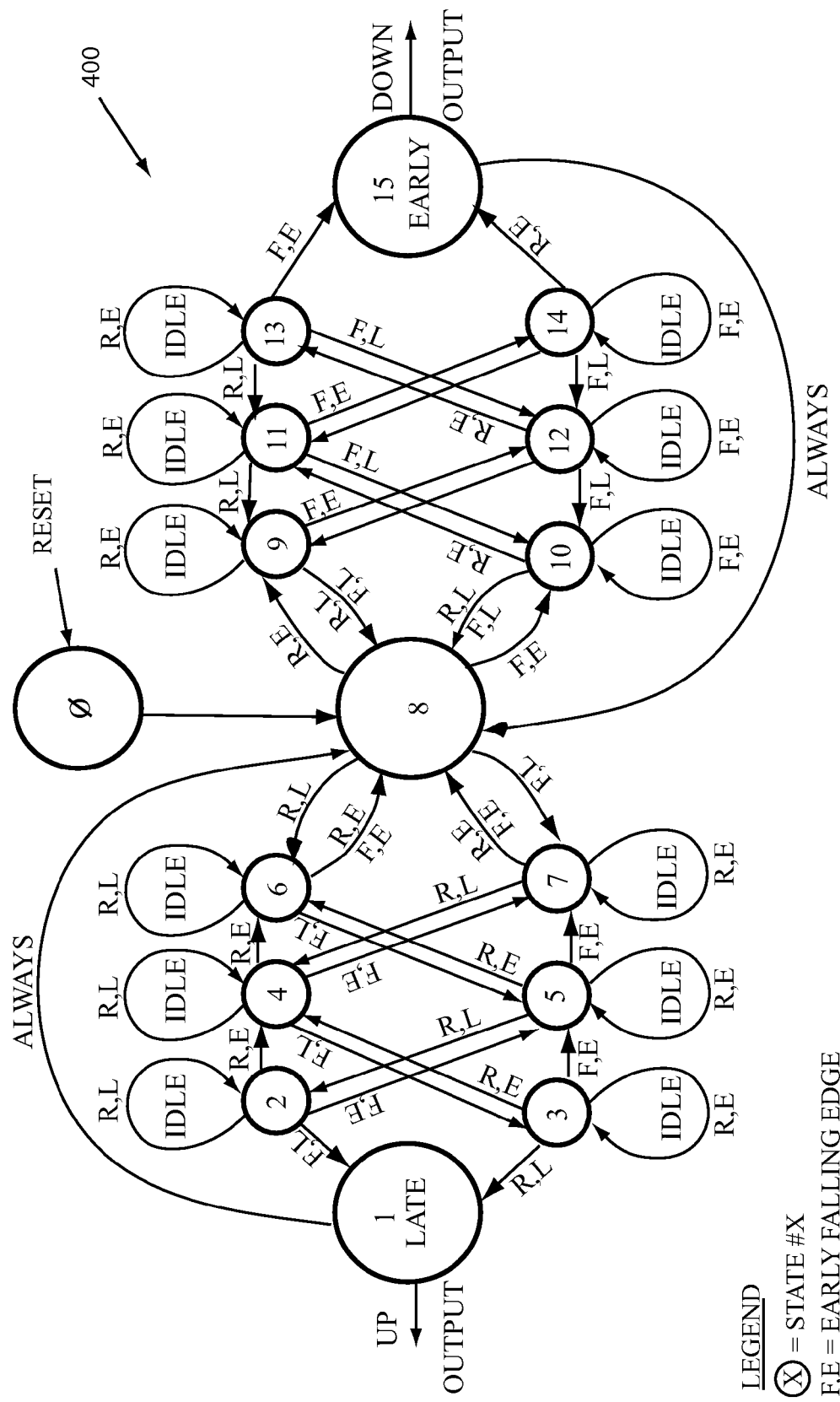
FIG. 4 depicts an example of a state machine such as the edge sensitive state machine in FIG. 2 to determine phase changes for a sampling clock signal based upon a substantially symmetrical sampling of rising and falling edges.

Edge analysis logic 222 may analyze the samples on a bit per bit basis to determine whether sampling clock 252 leads, lags or is at substantially the same phase as data signal 205. FIG. 3 illustrates an example of a truth table 300 for edge analysis logic 222. More specifically, columns 310 describe three input samples 218 (edge0, data, and edge1), which were consecutively measured from data signal 205 by sampling circuitry 215. Column 320 describes the analysis of the samples including abbreviations that are incorporated into the embodiment of the edge sensitive sate machine 242 depicted in FIG. 4. And, column 330 describes a three-bit output 224 (out0, out1, and out2). For example, in the first and last rows of truth table 300, all the input samples 218 (edge0, data, and edge1) are zero or one, respectively, which corresponds to no valid edge, an "idle" output indication represented by a one, zero, and zero for out0, out1, and out2, respectively. The "idle" output is also generated for input samples 218 of '010' and '101'.

Further, row two of truth table 300 identifies input samples 218 of '001' with a late rising edge 'r,1' and associates the late rising edge with a three-bit output 224 of '010'. Row four identifies input samples 218 of '011' with an early rising edge 'r,e' and associates the early rising edge with a three-bit output 224 of '011'. Row five identifies input samples 218 of '100' with an early falling edge 'f,e' and associates the early falling edge with a three-bit output 224 of '001'. And, row seven identifies input samples 218 of '110' with a late falling edge 'f,1' and associates the late falling edge with a three-bit output 224 of '000'.

In other embodiments, a different truth table may be implemented in edge analysis logic 222. Other truth tables may, for instance, be based upon types of edges, i.e., rising or falling, and a number of bit values received from sampling circuitry 215. For instance, in some embodiments, sampling circuitry 215 transmits three or more consecutive bit values to edge analysis circuitry 220 and edge analysis logic 222 transmits three or more outputs to edge sensitive state machine 242.

Edge sensitive state machine 242 may be a state machine having, e.g., 16 states, which is designed to determine phase adjustments for sampling clock 217 based upon samples associated with substantially equivalent numbers of rising and falling edges from data signal 205. Edge sensitive state machine 242 determines changes to the current state for edge sensitive state machine 242 based upon a current state of edge sensitive state machine 242, couples with latch 244 to change the current state, and couples with state 245 to track the current state. Upon changing the current state to a state associated with an up or down adjustment to the phase of the sampling clock 252, phase up/down output 246 generates an output for phase controller 240 indicating the phase adjustment.

Latch 244 may include a latch to receive the determination of edge sensitive state machine 242 about whether the phase of sampling clock 252 should be accelerated, delayed, or remain the same and state 245 maintains the state for the state for edge sensitive state machine 242 and returns the state to edge sensitive state machine 232 for each determination.

Phase up/down output 246 may produce an output for phase controller 240 based upon the contents of latch 244 and state 245. For example, when phase up/down output 246 produces an output for phase controller 240, phase controller 240 may generate a corresponding input for clock generator 250 and clock generator 250 may implement the changes to the phase of sampling clock 252 based upon instructions from phase up/down output 246.

FIG. 400 illustrates an embodiment of a 16-state, state machine 400 that also operates as a low pass filter. State machine 400 may perform the functions of, e.g., edge sensitive state machine 242, latch 244, state 245, and phase up/down output 246, to generate a phase adjustment signal for phase controller 240. State machine 400 determines phase adjustments based upon the current state (zero through 15) and an input 224. The input 224 may one of five possible inputs: early falling edge (F,E); late falling edge (F,L); early rising edge (R,E); late rising edge (R,L); and no action (idle). State machine 400 begins at state zero. At state zero, state machine 400 always adjusts the current state to state eight. At state eight, depending upon input 224, state machine 400 changes the current state to state six, seven, nine, or ten. In general, the current state progresses toward state one when input 224 indicates that the phase of sampling clock 252 should be adjusted up and progresses toward state 15 when input 224 indicates that the phase of sampling clock 252 should be adjusted down. For instance, in response to input 224 being (R,L), state machine changes the current state to state six. However, the state is changed back to state eight if the next input 224 is (R,E) or (F,E).

At state six, if the input 224 is (R,L) then state machine 400 does not change the current state. When the input 224 is (R,E) while in state six, the current state is changed to state five, progressing the current state toward state one. At state five, if the input 224 is (R,E) then state machine 400 does not change the current state but when the input 224 is (R,L), the current state progresses to state two. Then, at state two, if the input 224 is (R,L), the current state does not change but if input 224 is (F,L) the current state progresses to state one. At state one, state machine 400 produces an output for phase controller 240, indicating that the phase of sampling clock 252 is to be adjusted up. Similarly, the current state may progress through states seven, four, and three to state one when the input 224 begins with (F,L) instead of (R,L) while in state eight and then alternates between (R,L) and (F,L).

The current state of state machine 400 progresses toward state 15 when receiving an alternating pattern of inputs including (R,E) and (F,E). In particular, when the current state is state eight and input 224 is (R,E), state machine 400 changes the current state to state nine. A second (R,E) in a row maintains the current state at state nine while an input 224 of (F,E) progresses the current state to state 12 and an input 224 of (R,L) or (F,L) returns the current state to state eight. From state 12, inputs 224 of (R,E) and (F,E) in that order progresses the current state to state 15. State machine 400 produces an output for phase controller 240, indicating that the phase of sampling clock 252 is to be adjusted down. Similarly, the current state may progress through states 10, 11, and 14 to state 15 when the input 224 while in state eight begins with (F,E) instead of (R,E) and then alternates between (R,E) and (F,E). After producing either an output to adjust the phase of sampling clock 252 up or down, the state of state machine 400 is returned to state eight to start again.

Referring again to FIG. 2, phase controller 230 may interpret the up or down output from phase up/down output 246 and generate signals for clock generator 250 to implement the phase adjustments for sampling clock 252. In further embodiments, phase controller 240 may also include additional logic to interpret the phase adjustments requests from edge analysis circuitry 220 to determine whether the phase of sampling clock 252 should be modified. For example, phase controller 240 may track third order variations in the phase of data 205 to anticipate subsequent changes in the phase of sampling clock 252. Phase controller 240 can then modify requests for changes to the phase of sampling clock 252 based upon the third order variations.

Referring now to FIG. 5, there is shown an embodiment of a flow chart 500 to implement phase adjustments for a sampling clock of a clock and data recovery (CDR) loop such as CDR loop 110 shown in FIG. 1, based upon subsets of data samples derived from an incoming data signal. Flow chart 500 begins with receiving a data signal (element 510). For example, the data signal may include a data signal that was clocked and transmitted without the corresponding clock signal to increase data bandwidth and to reduce noise associated with transmitting a clock signal along with a data signal.

The sampling clock is divided by N (element 515) to produce a clock having a frequency of 1/Nth the frequency of the sampling clock. The circuitry of the CDR loop can then operate based upon the divided sampling clock, reducing the number of changes in state that components implement, which in turn, reduces power consumed by the CDR loop. Further, when components operate at a lower frequency, the operating voltage necessary for the components to function correctly is typically lower affording additional power savings in some embodiments.

In some embodiments, the CDR loop receives small sets of consecutive sample values for bits of the data signal at a frequency related to the divided frequency. In other embodiments, the CDR loop receives bursts of large sets of consecutive sample values. In one embodiment, the bursts of data are received at frequency of the divided clock. In another embodiment, the bursts are received in a short period of time relatively near the time of taking the samples. Then the edge analysis circuitry is placed in a sleep mode, or low power mode, for a period of time until the next burst. The sleep period may be based upon the number of phase modification made in response to a prior burst of sample values.

Transitions of a sampling clock and a clock having an offset by 90 degrees from the sampling clock may trigger sampling circuitry to determine values of the data signal (element 520). For example, the sampling clock may be received by the sampling circuitry and a circuit element designed to delay the sampling clock signal may be utilized to generate a second clock signal that lags the sampling clock signal, providing more than two transitions for sampling values per bit from the data signal when the sampling clock signal is close to the same frequency as the data signal.

Edge analysis circuitry can then analyze the bit samples to associate the samples with rising and falling edges as well as whether transitions of the sampling clock are late or early to determine a phase relationship between the data signal and the sampling clock signal (element 525). For instance, three sample values may be taken per bit. Two of the sample values fall within the sampling window and one sample value may fall within the sampling window of the next bit. Thus, the data may indicate that the phase of the sampling clock signal lags the phase of the data signal.

An edge sensitive state machine may then analyze the phase offsets associated with the rising and falling edges to determine whether the phase of the sampling clock should be adjusted (element 530) and, when the number of rising and falling edges being analyzed is substantially the same (element 535), the state machine may generate a signal indicating to a phase controller that the phase of the sampling clock should be adjusted (element 550). More specifically, a phase controller may receive the signal and transmit a signal to a clock generation circuit to step up the phase or step back the phase of the sampling clock to track the data signal. The clock generation circuit modifies generation of the sampling clock signal to incorporate the phase change. The clock generation circuitry then outputs the sampling clock to the sampling circuitry to take the subsequent set of sample values.

While the numbers of rising and falling edges are not substantially equivalent, the edge analysis circuitry continues to monitor differences between the phase of the sample clock signal and the phase of the data signal until the numbers of rising and falling edges are substantially equivalent (element 535). In further embodiments, the phase controller may monitor third order variations in the phase differences between the sample clock signal and the data signal, advantageously providing additional analysis with regard to changes in phase to implement track with the sampling clock.

It will be apparent to those skilled in the art having the benefit of this disclosure that the present invention contemplates methods and arrangements to determine phase adjustments for a sampling clock of a clock and data recovery (CDR) loop based upon subsets of data samples derived from an incoming data signal for reducing power consumption by the CDR loop. It is understood that the form of the invention shown and described in the detailed description and the drawings are to be taken merely as examples. It is intended that the following claims be interpreted broadly to embrace all the variations of the embodiments disclosed.

What is claimed is:

1. A clock and data recovery (CDR) loop, comprising:
   sampling circuitry to determine values for bits in a data signal based upon transitions of a sampling clock; and
   edge analysis circuitry coupled with the sampling circuitry to determine a phase adjustment for the sampling clock based upon a subset of the values for the bits, the subset of the values having substantially equivalent numbers of rising edges and falling edges, the rising edges and the falling edges being associated with transitions of the data signal, wherein the phase adjustment is adapted to track a difference in phase between the sampling clock and the data signal.

2. The CDR loop of claim 1, further comprising a phase controller coupled with the edge analysis circuitry to modify a phase of the sampling clock based upon the phase adjustment.

3. The CDR loop of claim 1, wherein the sampling circuitry comprises a clock divider to produce a divided sampling clock signal by dividing a frequency of the sample clock by a number.

4. The CDR loop of claim 3, wherein the clock divider comprises a clock divider in which the number is adjustable.

5. The CDR loop of claim 3, wherein the sampling circuitry comprises latches operating at a frequency based upon the divided sampling clock signal to provide the subset of the values to the edge analysis circuitry.

6. The CDR loop of claim 1, wherein the edge analysis circuitry comprises logic to analyze small sets of consecutive values of the subset, wherein the small sets are received at a frequency lower than the frequency of the sampling clock.

7. The CDR loop of claim 1, wherein the edge analysis circuitry comprises logic to analyze a burst of consecutive values of the values for bits, the edge analysis circuitry being adapted to enter a low power mode between determining the phase adjustment and receipt of a subsequent burst.

8. The CDR loop of claim 1, wherein the edge analysis circuitry comprises a state machine to track the numbers of rising edges and the falling edges associated with the subset to determine the phase adjustment.

9. A system, comprising:
   a clock generator to generate a sampling clock;
   sampling circuitry to sample values for bits from a data signal based upon the sampling clock to output the bits in a second data signal;
   edge analysis circuitry coupled with the sampling circuitry to analyze a subset of the values for bits to generate a phase adjustment indicative of a difference between a phase of the sampling clock and a phase of the data signal, wherein the subset of the values represent substantially equal numbers of values for rising edges and falling edges of the data signal; and
   a phase controller to adjust the phase of the sampling clock in response to the phase adjustment.

10. The system of claim 9, wherein the sampling circuitry comprises a clock divider to divide the sampling clock, wherein the divided sampling clock determines a frequency of operation for the edge analysis circuitry.

11. The system of claim 10, wherein the edge analysis circuitry comprises components adapted to operate at a reduced voltage based upon a frequency of the divided sampling clock.

12. The system of claim 9, wherein the edge analysis circuitry is adapted to analyze a burst of consecutively sampled values of the subset of the values for a first period of time followed by entering a sleep mode for a second period of time, the second period of time being longer than the first period of time.

13. The system of claim 9, wherein the edge analysis circuitry comprises edge analysis logic to associate the subset of values with phase offsets.

14. The system of claim 9, wherein the edge analysis circuitry comprises an edge sensitive state machine to monitor a trend of phase offsets indicated by the subset of the values to determine the phase adjustment for the sampling clock.

* * * * *